(12) United States Patent
Ucok et al.

(10) Patent No.: US 6,958,531 B2
(45) Date of Patent: Oct. 25, 2005

(54) MULTI-SUBSTRATE PACKAGE AND METHOD FOR ASSEMBLING SAME

(75) Inventors: Asli B. Ucok, Ann Arbor, MI (US); Khalil Najafi, Ann Arbor, MI (US); Joseph M. Giachino, South Lyon, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 45 days.

(21) Appl. No.: 10/713,852

(22) Filed: Nov. 14, 2003

(65) Prior Publication Data

US 2005/0121763 A1 Jun. 9, 2005

(51) Int. Cl.$^7$ .............................................. H01L 23/02
(52) U.S. Cl. ........................ 257/685; 257/686; 361/735
(58) Field of Search ................................. 257/685, 686; 361/640, 657, 666, 724, 725, 726, 727, 735

(56) References Cited

U.S. PATENT DOCUMENTS

| | | | | |
|---|---|---|---|---|
| 5,016,138 A | * | 5/1991 | Woodman | 361/688 |
| 5,343,075 A | * | 8/1994 | Nishino | 257/686 |
| 5,448,511 A | * | 9/1995 | Paurus et al. | 365/52 |
| 5,701,233 A | | 12/1997 | Carson et al. | |
| 5,721,452 A | * | 2/1998 | Fogal et al. | 257/685 |
| 5,754,405 A | * | 5/1998 | Derouiche | 361/744 |
| 5,869,353 A | * | 2/1999 | Levy et al. | 438/109 |
| 6,208,521 B1 | * | 3/2001 | Nakatsuka | 361/749 |
| 6,677,670 B2 | * | 1/2004 | Kondo | 257/686 |
| 2004/0099938 A1 | * | 5/2004 | Kang et al. | 257/686 |

OTHER PUBLICATIONS

Al–Sarawi, Said F., et al., A Review of 3–D Packaging Technology, IEE Transactions On Components, Packaging And Manufacturing Technology, 21, No. 1, pp. 2–14, Feb 1998.

Schuenemann, Matthias, et al., MEMS Modular Packaging And Interfaces, Proc. Of The 50$^{th}$ Electronic Components And Technology Conference, pp. 681–688, 2000.

Miller, David C., et al., Microrelay Packaging Technology Using Flip–Chip Assembly, Proc. Of The 13$^{th}$ International Conference On Micro–Electro–Mechanical Systems, pp. 265–270, Miyazaki, Japan, Jan. 23–27, 2000.

Mason, Andrew, et al., A Generic Multi–Element Microsystem For Portable Wireless Applications, Proc. Of The IEEE, pp. 1733–1746, Aug., 1998.

Goldstein, Harry, Packages Go Vertical, IEEE Spectrum, pp. 46–51, Aug., 2001.

Gann, Keith D., Neo–Stacking Technology, HDI Magazine, Dec., 1999.

Bakir, Muhannad S., et al., Sea of Leads (SOL) Ultrahigh Density Wafer–Level Chip Input/Output Interconnections For Gigascale Integration (GSI), IEEE Transactions On Electron Devices, vol. 50, No. 10, Oct., 2003.

Murari, Bruno, Bridging The Gap Between The Digital And Real Worlds: The Expanding Rule of Analog Interface Technologies, 2003 IEEE International Solid–State Circuits Conference, Plenary Session 1.3, Feb. 10, 2003.

* cited by examiner

Primary Examiner—Jasmine Clark
(74) Attorney, Agent, or Firm—Brooks Kushman, P.C.

(57) ABSTRACT

A multi-substrate, microsystem package and a method for assembling same including a high-density flexible connector array are disclosed for use in compact and multi-substrate packages containing circuits, sensors, and actuators in a re-workable and modular approach. The package is designed as a cube with highly flexible connectors providing electrical and fluidic connections between the substrates. The cables are integrated in the inside walls of the cube and make pressure contacts to the pads on stacked substrates. The cables are designed to be flexible and capable of being manipulated so that individual dice can be inserted to populate the cube. Several material candidates for the cables, including polymers such as Parylene, and metal such as gold, are provided.

22 Claims, 6 Drawing Sheets

MULTI-SUBSTRATE PACKAGE AND METHOD FOR ASSEMBLING SAME

STATEMENT REGARDING FEDERALLY SPONSORED RESEARCH OR DEVELOPMENT

This invention was made with Government support under Award No. EEC-9986866 by the National Science Foundation Engineering Research Centers Program. The Government has certain rights in the invention.

BACKGROUND OF THE INVENTION

1. Field of the Invention

This invention relates to a multi-substrate package and method for assembling same

2. Background Art

Previous research on manufacturing dense packages involved various multi-chip module technologies, including chip scale packaging using solder, wire bonding, flex substrates, epoxy layers, filled vias, microrelays, and ceramic clusters.

The following publications show such technologies:

1. S. F. Al-Sarawi et al., "A Review of 3-D Packaging Technology," IEEE TRANSACTIONS ON COMPONENTS, PACKAGING, AND MANUFACTURING TECHNOLOGY, 21, No. 1, pp. 2–14, February 1998;
2. M. Schuenemann et al., "MEMS Modular Packaging and Interfaces," PROC. OF THE 50 TH ELECTRONIC COMPONENTS AND TECHNOLOGY CONFERENCE, pp. 681–688, 2000;
3. D. C. Miller et al., "Micro-relay Packaging Technology Using Flip-Chip Assembly," PROC. OF THE 13 TH INTERNATIONAL CONFERENCE ON MICRO-ELECTRO-MECHANICAL SYSTEMS, pp. 265–270, Miyazaki, Japan, Jan. 23–27, 2000;
4. A. Mason et al., "A Generic Multi-Element Microsystem for Portable Wireless Applications," PROC. OF THE IEEE, PP. 1733–1746, August, 1998;
5. H. Goldstein, "Packages Go Vertical," IEEE SPECTRUM, pp. 46–51, August, 2001;
6. K. D. Gann, "Neo-Stacking Technology," HDI MAGAZINE, December, 1999;
7. M. S. Bakir et al., "Sea of Leads (SoL) Ultrahigh Density Wafer-Level Chip Input/Output Interconnections for Gigascale Integration (GSI)," IEEE TRANSACTIONS ON ELECTRON DEVICES, Vol. 50, No. 10, October, 2003; and
8. B. Murali, "Bridging the Gap Between the Digital and Real Worlds: The Expanding Rule of Analog Interface Technologies," 2003 IEEE INTERNATIONAL SOLID-STATE CIRCUITS CONFERENCE, Plenary Session 1.3, Feb. 10, 2003.

U.S. Pat. No. 5,701,233 discloses stackable modules and multi-modular assemblies.

However, of the above prior art, none provides the flexibility, modularity, and small size needed for a microsystem containing substrates with sensors, actuators, and circuits fabricated using different technologies.

Modularity and reworkability are particularly important in multi-substrate packages typically encountered in microsystems. Although it is possible to use completely disposable systems and throw out the entire system when it malfunctions (either in-situ after it is in the field, or after the completion of the manufacturing process), it is often desirable to have some level of reworkability to be able to replace any given die in a multi-substrate package. Already operational dice can be lost when, for example, the system package is being repaired to replace other malfunctioning dice. Replacement of these defective dice is a complex procedure, which may result in loss of electrical connection during the removal process. Inhibited access to the component pad site due to the high component population densities is another problem. Reworking is not practical in a hard-wired system.

Reworkability of microsystems with dice containing MEMS devices is yet more difficult, because these devices often contain fragile structures, and assembly and reworking becomes even more challenging. However, in most microsystems applications, the number of output pads needed for signal transfer is fewer than what is typically needed in VLSI circuit chips, which typically require hundreds of I/Os per chip. For a die with MEMS structures, it is usually the structure size, not the pad size that defines the die size, so the minimum pitch and pad size can be on the order of 100s of microns compared to IC's minimum pad size required of 50–100 $\mu$m.

Although these specifications seem to make microsystems with MEMS devices easier to assemble, there are additional assembly and packaging challenges involved with such microsystems. High quality signal transfer from the sensor to its readout circuitry is important for increasing the resolution and dynamic range of the system. Decreasing the length of interconnection lines and eliminating large-scale connections between dice are required for better system performance. This is also the motivation behind much of the research in various areas of microsystems to integrate sensors and actuators with electronics. Moreover, due to the large variety of MEMS devices, not only electrical connections, but also fluidic and/or optical connections are needed between dice of a microsystem.

In the case of fluidic connections, chemical reaction between the fluidic connector material and the sample fluid flowing in the fluidic channels, hermeticity of the fluidic channel itself, and hermeticity of the seal between the connector and the inlet on the MEMS sensor are some of the factors that determine the quality of fluidic connections. For a high-sensitivity gas sensing system, for example, even the smallest amount of gas is important, and should not be lost due to leakage in the connector path.

SUMMARY OF THE INVENTION

An object of the present invention is to provide a reworkable, compact and modular multi-substrate package and method for assembling same.

In carrying out the above object and other objects of the present invention, a multi-substrate package is provided. The package includes a housing, a stack of substrates disposed within the housing, and an array of connectors including a plurality of channels supported by the housing. The connectors are movable between extended and retracted positions within the housing. The connectors connect multiple substrates in the extended positions of the connectors to communicate the multiple substrates along the channels.

The package may further include at least one actuator for moving the connectors between the extended and retracted positions.

The connectors may be flexible connectors and the at least one actuator may flex the connectors so that the connectors move between the extended and retracted positions.

The channels may include fluid channels and the connectors may include fluid connectors.

The channels may include electrical channels and the connectors may include electrical connectors.

The package may further include at least one resilient sheet for separating the multiple substrates and applying a force between the connectors and the substrates required for proper communication of the multiple substrates.

The housing may include a cover for applying a force to the stack. The at least one resilient sheet may be compressed by the force to the stack so that the at least one resilient sheet presses terminations of the connectors against terminations on the substrates. Contacts between the connectors and the substrates at the terminations may be pressure contacts.

The housing may include side walls and the connectors may be formed on the side walls.

The housing may be rectangular in shape.

The at least one actuator may include an electrostatic, magnetic, piezoelectric, or thermal actuator.

The connectors may be made from Parylene or any other suitable polymer, metal or inorganic dielectric.

Distal ends of the connectors may have termations formed thereon and the substrates may have termations which match the terminations of the connectors to form a connect/disconnect system.

The housing may include a plurality of connector substrates which support the connectors.

The package may further include a sensor supported on a sensor substrate exposed to an environment of the package. The rest of the substrates may be hermetically sealed from the environment by the housing and the sensor substrate.

The connectors may permit removal of the substrates from the housing in retracted positions of the connectors.

The package may further include a battery disposed within the housing for providing electrical power to the substrates.

The connector array may include at least one flexible cable.

The housing may be a folded housing.

The channels may include fluid and electrical channels and the connectors may include fluid and electrical connectors including the fluid and electrical channels, respectively.

The package may further include at least one MEMS device supported on a MEMS substrate.

The array may include rows of movable connectors and each row may be individually movable.

Distal ends of the connectors may be locally adjacent an inner surface of the housing in the retracted positions to allow both insertion and removal of the substrates from the housing.

Further in carrying out the above object and other objects of the present invention, a method for assembling a multi-substrate package is provided. The method includes providing a folded housing and an array of flexible connectors supported by the housing. The connectors include a plurality of channels. The method further includes stacking substrates within the folded housing so that the substrates are aligned within the folded housing. The method still further includes flexing the connectors so that the connectors move between extended and retracted positions within the folded housing. The connectors connect multiple substrates in the extended positions of the connectors to communicate the multiple substrates along the channels. The connectors allow the substrates to be stacked in the folded housing in the retracted positions of the connectors.

The step of providing may include the step of folding a plurality of interconnected substrates to obtain the folded housing.

The method may further include placing a resilient sheet between adjacent stacked substrates for applying a force between the connectors and the substrates required for proper communication of the adjacent stacked substrates.

A top stacked substrate may have a sensor supported thereon exposed to an environment of the package.

The step of stacking may be performed through a top opening in the folded housing. The method may further include placing a cover in the top opening to apply a force to the stack so that the resilient sheet between adjacent stacked substrates is compressed by the force to the stack so that the resilient sheet presses terminations of the connectors against terminations on the substrates. Contacts between the connectors and the substrate at the terminations may be pressure contacts.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

In general, what is described herein is a new approach for the assembly of microsystems including multiple substrates which typically contain circuits, sensors, and actuators in a reworkable and modular fashion. The microsystem dice or substrates are placed inside a cube, and are therefore self-aligned and stacked on top of one another, and are separated using non-conducting elastomer sheets. Signal transfer (electrical and fluidic) between these dice is achieved using flexible cables that are formed on the inside walls of the cube. These flexible cables can be made out of Parylene or any other suitable polymer, metal or inorganic dielectrics. The cables are typically actuated by electrostatic, magnetic, thermal or piezoelectric actuation. Conductors and contact pads formed on the cables are pressed onto matching contact pads on the individual substrates thus forming a mechanical connect/disconnect system for both electrical and fluidic signals (fluidic channels on the cables and inlets on the substrates for fluidic signals). A process for forming the cables and for assembling the entire microsystem package is described herebelow.

Figure 1:
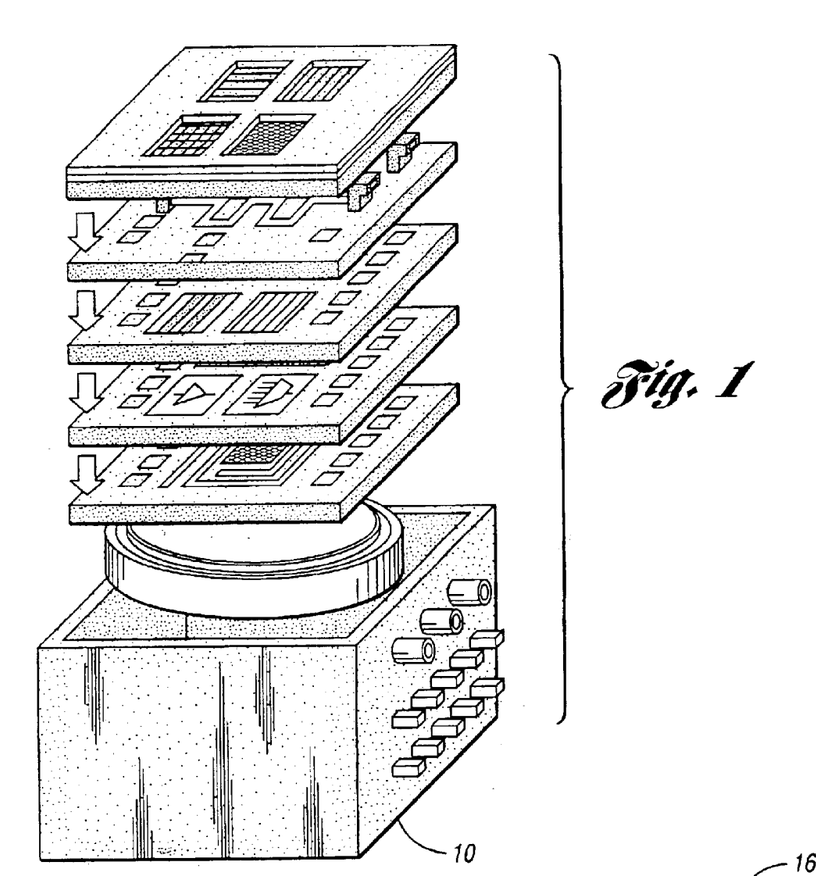
FIG. 1 is an exploded, perspective view of a microsystem package which contains various sensors, actuators, circuitry, and a battery.
Figure 2A:
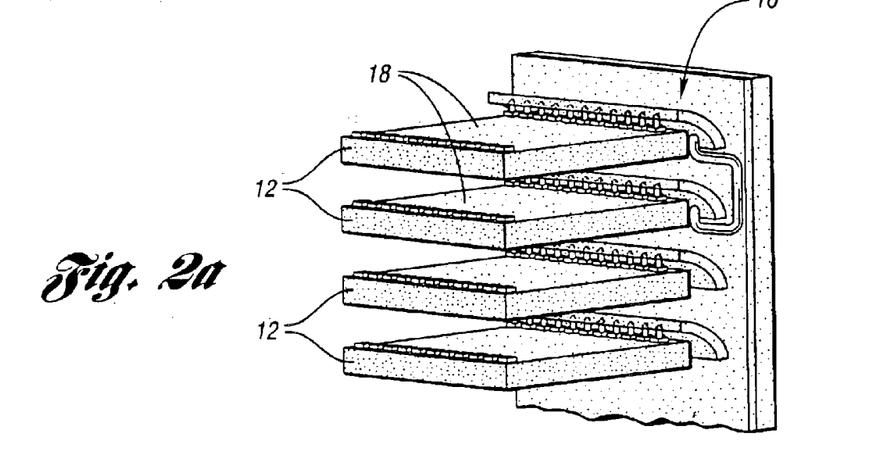
FIGS. 2a and 2b are schematic perspective views, with FIG. 2b being a slightly enlarged section of FIG. 2a, showing a portion of a reworkable and modular package for the multi-substrate microsystem of FIG. 1; flexible cables make pressure contacts to pads and fluidic channels on the system dice.
Figure 2B:
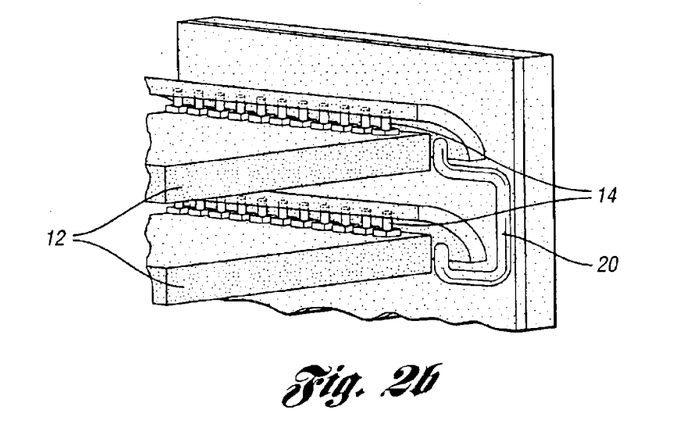
Figures 8, 9, 10, 11:
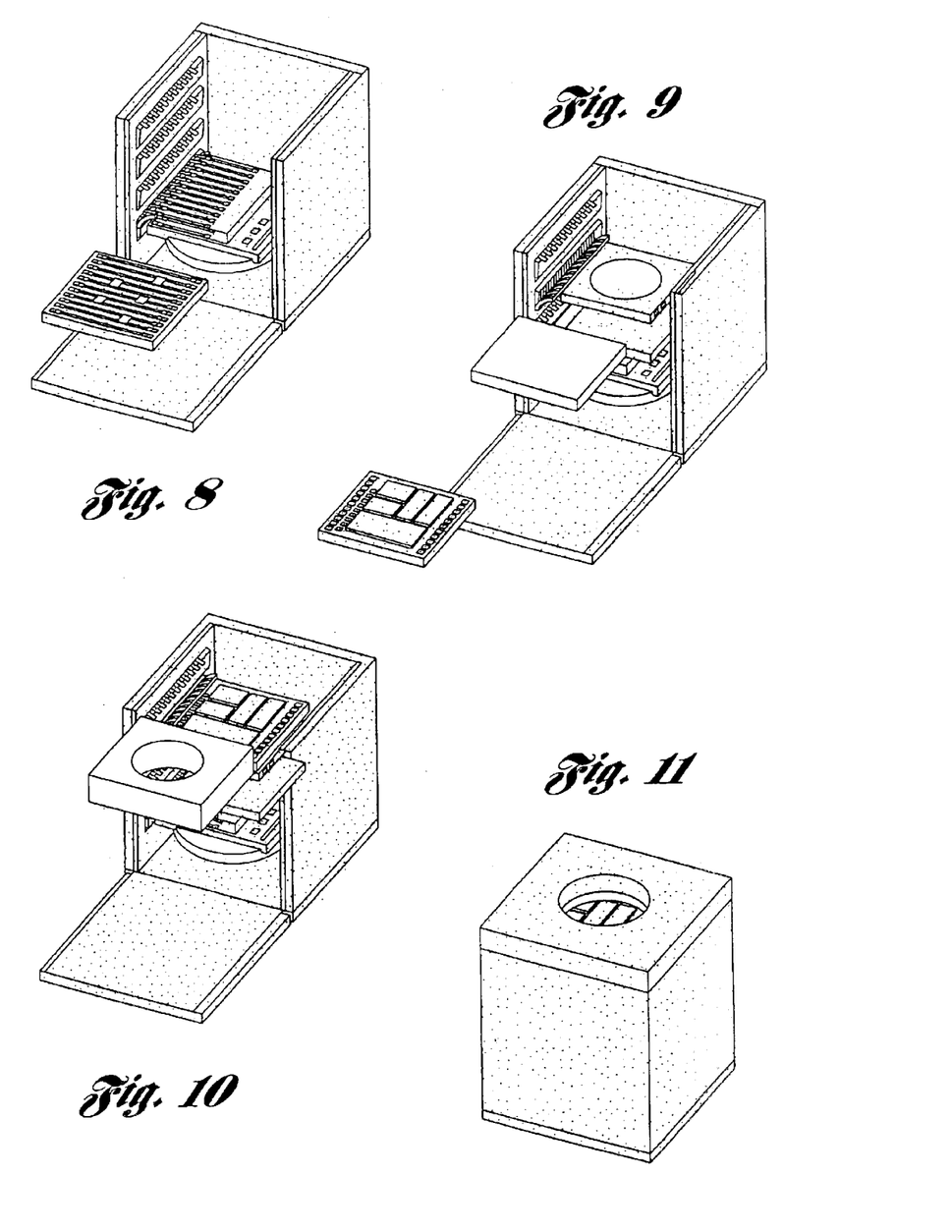
FIG. 8 is a perspective schematic view of dice stacked within the housing with an elastomer layer therebetween.
FIG. 9 is a perspective schematic view showing the further assembly of the package in a fashion similar to that shown in FIGS. 6–8.
FIG. 10 is a perspective schematic view showing the elastomer layer about to be placed on top of an exposed sensor module.
FIG. 11 is a perspective schematic view showing a completed package with a lid.

A high-density, removable mechanical connect/disconnect system for the electrical and fluidic connection of a multi-substrate microsystem of FIG. 1 is shown in FIGS. 2a and 2b. A cube 10 of FIG. 10 contains the system modules including substrates 12 or dice self-aligned, and mechanically registered, and stacked on top of one another. The electrical and fluidic connections between the dice 12 are achieved using flexible cables 14 fabricated on the inside walls 16 of the cube 10. Cables 14 make pressure contacts to the pads and fluidic channel openings on the system dice 12. The necessary force is applied at top surfaces 18 of the substrates by the cover of the cube (i.e., FIG. 11), and non-conducting elastomer sheets (not shown) used between the stacked substrates 12 provide flexible surfaces for the transfer of this force to the flexible cables 14. The amount of applied force is based on the electrical contact resistance required for electrical connectors and on the hermetic seal required between the connector and inlet holes for fluidic connectors.

The flexible cables 14 allow transfer of electrical and fluidic signals between multiple substrates 12 in the packaging approach illustrated by FIG. 1.

Cable Structure and Design

The flexible ribbon cables 14 that transfer signals between different substrates 12 provide a number of features and satisfy a number of requirements. First, and foremost, the cables 14 should be mechanically flexible, but also rugged. They should be capable of providing both electrical and fluidic signal transport, which means that they should provide both electrical and fluidic isolation. The cable material should be capable of long-term use and exposure, to different fluids, and should be compatible with standard IC processing. Several possible materials for the cables include silicon/polysilicon, inorganic dielectric materials such as silicon oxide/nitride, metal films such as gold (or other "soft" metals), and finally polymers, such as polyimides, Parylene, and liquid-crystal polymers (LCP). Silicon and polysilicon have been used for making multi-lead ribbon cables for implantable biomedical applications, and have many desirable features. Silicon can be easily micromachined, is quite flexible when thin, and is inert. Inorganic insulating films, such as silicon oxide and nitride, are also excellent candidates because they are very flexible and can be easily processed. However, both silicon and thin-film inorganic dielectrics are brittle and may not be able to withstand large out-of-plane stresses and deflections. Although a disadvantage, this may not be as big of an issue in the design of the proposed microsystem package since the deflections of these cables can be more or less controlled. Other candidate materials include thin metal films, and polymers. Both of these materials are compliant, ductile, and can plastically deform, so they may be more suitable for this application. Polymers are more attractive because they are insulating and can therefore be easily used to support metal conductors needed for electrical signal transfer. For example, Parylene is an excellent dielectric with very desirable properties, including good electrical isolation and excellent corrosion resistance. In addition, it can be deposited conformally at room temperature. It is the first candidate of choice.

Parylene cables may contain metal lines for electrical connection, and microfabricated channels for fluidic connection. As discussed above, the electrical and fluidic buses are routed through the sidewalls 16 of the cube 10, as indicated at 20, enabling signal transfer between the stacked substrates of the microsystem, as shown in FIGS. 2a and 2b. In FIGS. 2a and 2b, one of the four sidewalls 16 of the cube 10 is shown, and a number of substrates 12 are shown, which could be either sensor, actuator, or IC substrates. The substrates 12 are stacked on top of one another, and in between them are placed the compliant elastomeric spacers that act not only to set the substrates 12 apart, but also to absorb any large mechanical stresses and forces that could potentially damage the device substrates 12. The flexible cables 14 are attached to the cube sidewall 16. The cables 14 carry electrical and fluidic interconnects, and therefore have appropriate terminations to match with those on the device substrates 12. As evident, the cables 14 are capable of bending out-of-plane by some amount (at least a 90° arc is needed for some applications), and they should be capable of supporting movement up and down and sideways (shear and twisting actions). The cable terminations are pressed against the terminations on the substrates 12 by the mechanical force applied on top of the stack after the substrates 12 are all placed inside the cube 10. Therefore, the connection between the cables 14 and the substrates 12 can be easily removed once the substrates 12 are removed from the cube 10. It is also clear from FIG. 2 that the rows of cables 14 need to be individually manipulated into position after each substrate 12 is placed inside the cube 10.

Referring to FIGS. 5–11, this means that before a cube 10 is populated with any device substrate 12, all cables 14 need to be flat and pressed against the sidewall 16 so that the device substrates 12 can be dropped inside the open cube 10. Once the first substrate 12 is placed inside the cube 10, the bottom row of cables 14 is released, or actuated, into position and then the first elastomer sheet could be placed inside the cube 10, followed by the second device substrate 12, and the actuation or release of the second row of cables 14. This sequence could be repeated as many times as needed. Therefore, one of the functions for each row of cables is actuation. The cables 14 should be flat and pressed against the surface of the sidewall 16 in order to be able to insert device substrates 12 inside the cube 10.

Figure 12:
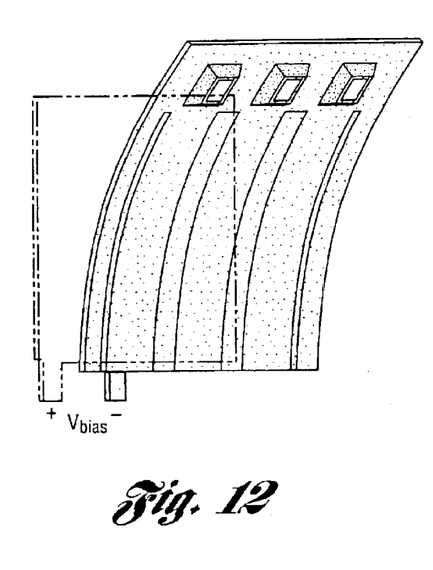
FIG. 12 is a schematic view of a conductive plate (on a cube wall) and a conductive plate (on a cable) for electrostatic actuation of the cable; the metal layers are only schematically shown.

One possible approach to do this is to use electrostatic actuation as shown in FIG. 12 by applying a voltage between a given row of cables 14 and the sidewall 16 (assuming the sidewall substrate 16 is either conductive or has a conductive layer or plate on it). Using this approach, it is possible to fabricate the cables 14 so that they curl up and away from the substrate 12 by utilizing the built-in stress in the film, and to pull them towards the sidewall substrate 16 using electrostatic force.

Specifically referring now to FIGS. 12–15, there are shown various cable actuators or actuation mechanisms.

Electrostatic Actuation

In this approach, the cables are in naturally-bent position due to intrinsic stress. During assembly, a voltage, $V_{bias}$, is applied to the two plates (one on the cube wall, the other on the cable), so that electrostatic attraction force makes the cable come close to the cube wall for easy assembly. FIG. 12 shows biasing for electrostatic actuation.

Thermal Actuation

Figure 13:
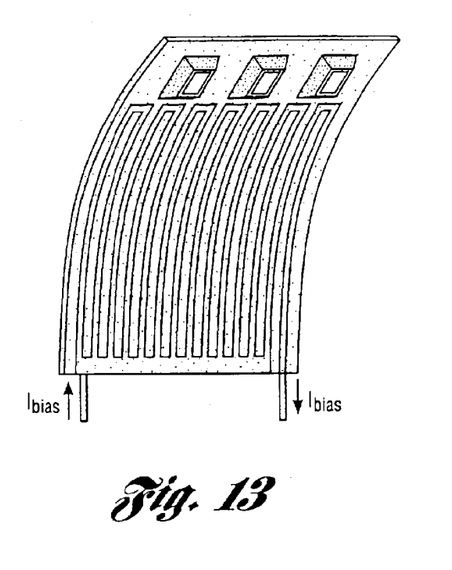
FIG. 13 is a schematic view of a resistor formed on a cable for thermal actuation of the cable; the metal layers are only schematically shown.

The current passing through the resistor on the cable of FIG. 13 results in heating and temperature increase in the cable. A stack of material on the cable with different coefficients of thermal expansion expand in different amounts, and result in actuation of the cable as shown in FIG. 13, which shows such biasing.

Magnetic Actuation

Figure 14:
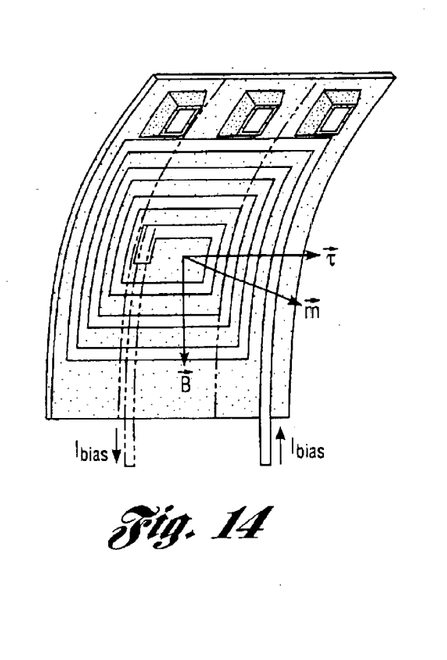
FIGS. 14 and 15 are schematic views of cables with a coil and a current-carrying wire, respectively, to provide magnetic actuation of their respective cables; the metal layer for electrical connection is only schematically shown.
Figure 15:
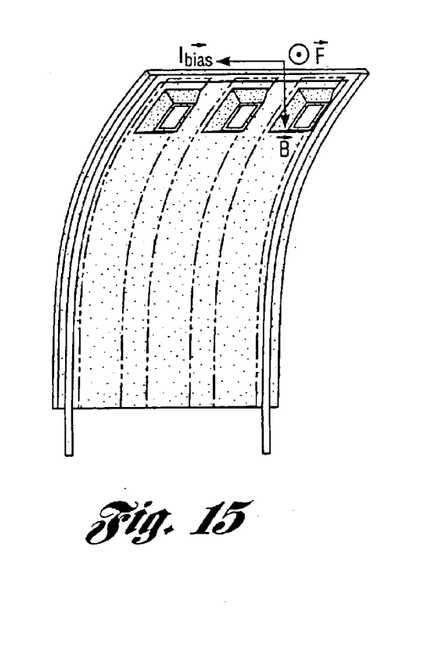

The two designs of FIGS. 14 and 15 use magnetic actuation for cables and assume that assembly takes place in a magnetic field. In FIG. 14, biasing for magnetic actuation uses a coil. Magnetic moment $\vec{m}$ that is generated by the current loop on cable and magnetic field $\vec{B}$ results in torque $\vec{\tau}$ In FIG. 15, biasing for magnetic actuation uses a current-carrying wire. $\vec{I_{bias}}$ and magnetic field $\vec{B}$ results in force $\vec{F}$. The magnetic field is applied in the indicated direction so that either:

a. Together with the magnetic moment of a current loop on the cable, a torque given by:

$$\vec{\tau} = \vec{m} \times \vec{B} \quad (a)$$

is generated. In Equation (a), $\vec{B}$ is the external magnetic field, and $\vec{m}$ is the magnetic moment of the current loop, which is a vector perpendicular to the current loop in the right-hand-rule direction. The vectors are also shown in FIG. 14.

b. Or together with a current flowing along the top edge of the cable a force:

$$\vec{F} = l\vec{I_{bias}} \times \vec{B} \quad (b)$$

is generated. In Equation (b), $\vec{I_{bias}}$ is the current vector in the direction of current flow, $\vec{B}$ is the external magnetic field, and l is the length of the wire at the top edge of the diaphragm, as shown in FIG. 15.

In addition to Parylene, it is also possible to use metal as the cable material. In this case, the cable cannot carry multiple electrical signals, but can be used as a fluidic connector. The attractive feature of metal cables is that they can be made quite thin, and they are ductile. Obviously, if the maximum load on the cable exceeds the plastic limit, the cable will be permanently shaped and bent. This may be acceptable since actuation can be used to pull the cables back toward the sidewall substrate when the package is being populated. Metal cables are also quite inert and do not react with gases (assuming the gases are not corrosive).

Cable Design

Mechanical flexibility is an important requirement for the cables 14 carrying signals between the device substrates 12 and the cube sidewall 16, where signals from different substrates 12 are routed. To make the cables 14 flexible, they need to either be made thin, or a suitable structure be chosen, by for example using corrugations in the cable, so that the final cable is compliant.

The flexibility of a beam is primarily defined by its spring constant, k, which for a bent cantilever beam fixed at one end is:

$$k = \frac{3EI}{L^3} \quad (1)$$

where E is the Young's modulus, I is the moment of inertia, and L is the length of the cantilever. For a simple cantilever, the moment of inertia, I, about a central axis is:

$$I = \frac{Wh^3}{12} \quad (2)$$

where W and h are the width and the thickness of the cantilever, respectively. For a Parylene cantilever beam 1200 $\mu$m long, 1500 $\mu$m wide, and 10 $\mu$m thick and fixed at long edge, I is $1.25 \times 10^5$ $\mu m^4$, and k is 0.60 N/m. Young's modulus of Parylene used in the calculation is 400,000 psi.

Theoretical calculations and ANSYS simulations show that Parylene cables can deflect hundreds of microns before they enter the plastic regime. A 1200 $\mu$m×1500 $\mu$m×10 $\mu$m Parylene cable under an applied force of $4.5 \times 10^{-4}$N has a maximum deflection of 549 $\mu$m. Maximum stress at the fixed edge varies between 19.8 MPa and 24.8 MPa, which is 2–3 times less than 55 MPa, the yield strength of Parylene. Simulations also show that maximum stress is observed at the two corners of the free end of the structure where the force is applied, but even this stress value is much less than the yield strength of Parylene. Simulations show that the spring constant, k, is 0.82 N/m, which is 27% more than the calculated value of k. This discrepancy is partly because of the small deflection approximation in the calculation of spring constant. For the same structure, maximum stress and maximum deflection values are calculated as 21.6 MPa and 752 $\mu$m, respectively.

Figure 3A:
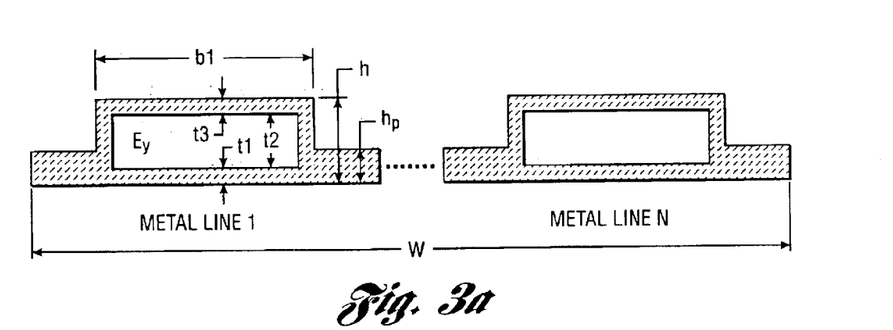
FIG. 3a is a sectional view of a Parylene cable with Au electrical connectors or channels.

For a cable with N conductor lines formed by a metal layer sandwiched between two Parylene layers, and separated equidistance from each other as shown in FIG. 3a, the moment of inertia about the central axis parallel to width is calculated as:

$$I = \frac{Nb_1 h^3}{12} + \frac{(W - Nb_1)h_p^3}{12} \quad (3)$$

and the spring constant is:

$$k = \frac{E_c N b_1 h^3}{4L^3} + \frac{E_x (W - Nb_1)h_p^3}{4L^3} \quad (4)$$

where $b_l$, h, and $h_p$ are as shown in FIG. 3a, $E_c$ is the Young's modulus of the composite structure, $E_x$ is the Young's modulus of the cable material, W is the width of the cable, and L is the length of the cable. Here, it is assumed that $b_l$ is much larger than the thickness of the deposited cable material.

Assuming that Poisson's ratios for the component layers are similar, the Young's modulus of the composite structure can be approximated as:

$$E_c h = E_x(t_1+t_3) + E_y t_2 \quad (5)$$

$t_1$, $t_2$, and $t_3$ are the thicknesses of the deposited layers as shown in FIG. 3a, $t_1$ and $t_3$ being the same material, and $E_y$ is the Young's modulus of the metal layer.

Figure 3B:
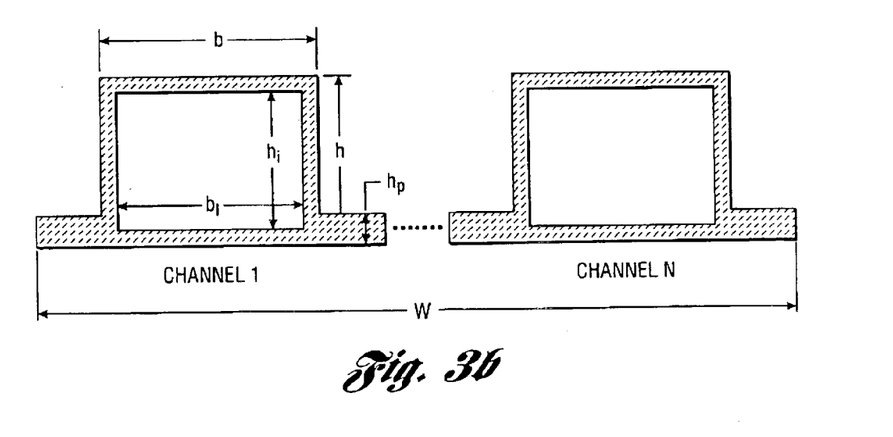
FIG. 3b is a sectional view of a Parylene cable with fluidic channels.

For a cable having N channels separated equidistance from each other as shown in FIG. 3b, the moment of inertia about the central axis parallel to width is calculated as:

$$I = \frac{N(bh^3 - b_i h_i^3)}{12} + \frac{(W - Nb)h_p^3}{12} \quad (6)$$

where b and h are the outer dimensions of the channel, $b_i$ and $h_i$ are the inner dimensions of the channel, $h_p$ is the total thickness of the deposited layer, and W is the total width of the cantilever. Spring constant, k, is calculated substituting Equation (6) in Equation (1).

Table 1 shows theoretical calculation results for different 1200 μm×1500 μm Parylene cables, fixed along its length. The Young's modulus and density of Parylene used in the calculations are 400,000 psi and 1.289 g/cm³, respectively. The Poisson's ratio for Parylene used in the calculations is 0.4. As calculations show, Parylene cables with electrical and fluidic connectors are slightly stiffer. For reworkability of the cables, it should be guaranteed that they do not enter the plastic regime of operation.

More flexible cable designs may be needed particularly for the ones with fluidic channels.

TABLE 1

|  | Various Dimensions (μm) | I (μm)⁴ | k (N/m) |
|---|---|---|---|
| No conductors | h = 10 | 1.25 × 10⁵ | 0.60 |
| 25 conductors per cable | $b_1$ = 40<br>$t_2$ = 0.1<br>$t_1$ = $t_3$ = 5<br>$h_p$ = 10 | 1.28 × 10⁵ | 0.87 |
| 6 fluidic channels per cable | b = 90<br>h = 20<br>$b_1$ = 80<br>$h_1$ = 10 | 4.00 × 10⁵ | 1.92 |

Fabrication

Prototype cables using both Parylene and gold have been fabricated. Parylene cables are more flexible than gold cables as expected.

FIGS. 4a–4e show the process flow for the fabrication of Parylene cables. The cross-sectional view of a cable with fluidic channels is shown on the left, and that of a cable with electrical conductors is shown on the right.

Figure 4A:
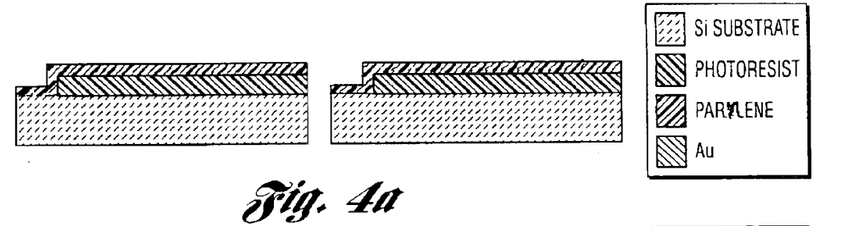
FIGS. 4a–4e are side views illustrating the process flow for the fabrication of Parylene cables with fluid and electrical connectors or channels on the left- and right-hand sides of the Figures, respectively, with no actuation layer.
Figure 4B:
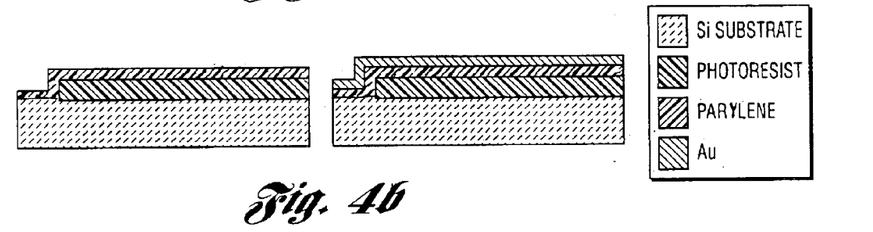
Figure 4C:
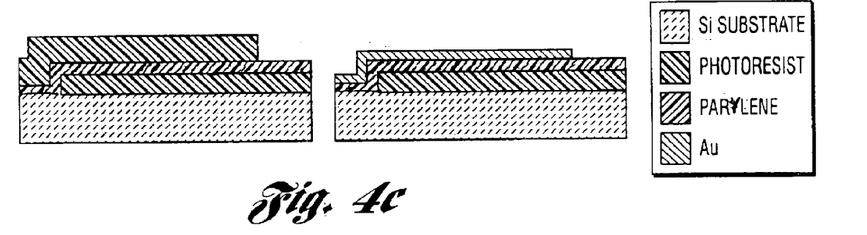

Fabrication starts with the lithography of the bottom sacrificial layer, which is removed at the last step to release the cables. Soft-baked photoresist is used as sacrificial layer (FIG. 4c). Cables with Al sacrificial layer are also fabricated. After the sacrificial layer definition, the first Parylene layer is deposited at room temperature using A-174 Silane, Parylene adhesion promoter (FIG. 4a). Deposited Parylene thickness varies between 2–5 μm for different designs. Next, the metal layer for electrical connectors is deposited and patterned (FIG. 4b). Gold is used for electrical connectors. However, it is to be understood that Cr/Au could be used instead of Au. It is observed that gold adheres to Parylene quite well even without any intermediate adhesion layer.

Figure 4D:
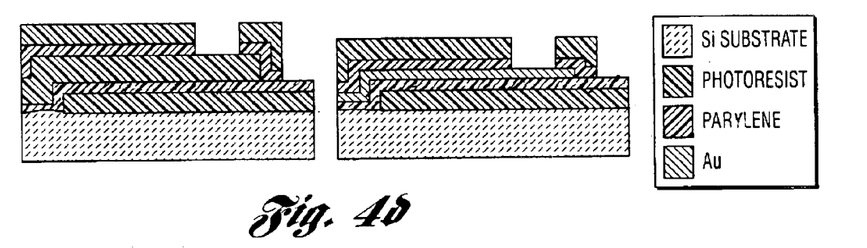
Figure 4E:
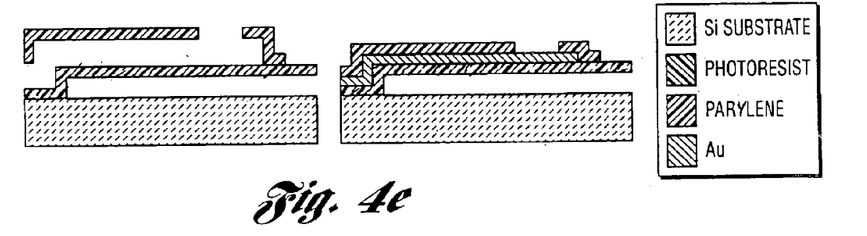
Figure 5:
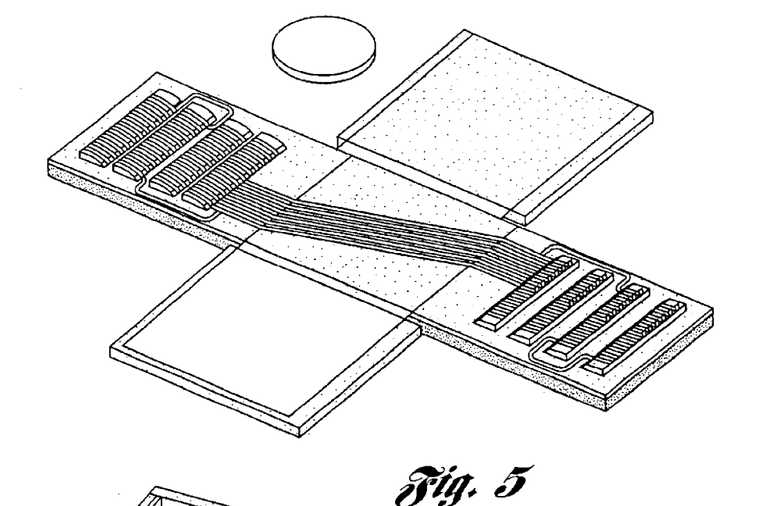
FIG. 5 is a schematic perspective view of an unfolded cube of the present invention with a battery prior to folding to form a folded housing.
Figures 6, 7:
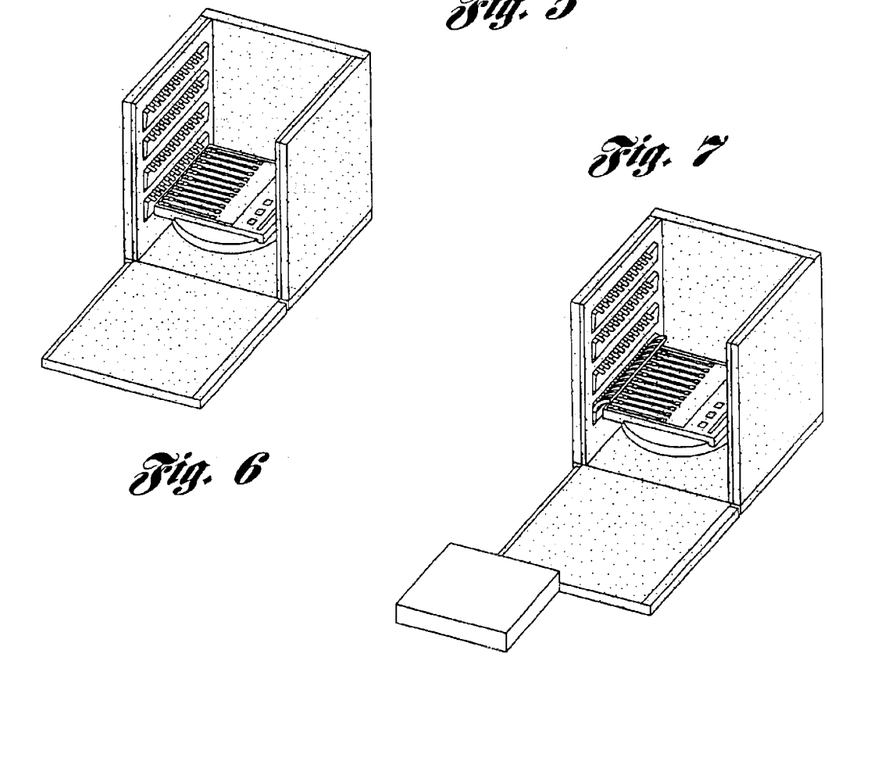
FIG. 6 is a perspective schematic view of a folded cube with modules or substrates starting to be stacked within the cube.
FIG. 7 is a perspective schematic view of the folded cube wherein a row of cables corresponding to a stacked die has moved to connect the die.

After patterning of the gold layer, a thick photoresist sacrificial layer is spun and patterned to realize fluidic channels (FIG. 4c). The height of channels defined by this photoresist thickness varies between 10 μm–20 μm. Next, the second Parylene layer is deposited again using A-174 as adhesion promoter (FIG. 4d). It is possible to do short $O_2$ plasma etch of the first Parylene layer surface to obtain better adhesion between the two Parylene layers. Lithography and RIE of Parylene form the large cables with many fluidic and/or electrical connectors (FIG. 4d). Access holes at the tip of each connector that make pressure contacts to the pads and fluidic channel openings on the system dice are also formed at this step (FIG. 4d). The last step is the removal of sacrificial layers in fluidic channels and under the structures to release the cables (FIG. 4e). As cables are quite large, during the release step, it takes a longer time if an aluminum sacrificial layer were used compared with a photoresist sacrificial layer. It has been observed that Parylene adhesion is compromised during a long release process. Therefore, choosing a sacrificial layer that can be removed fast becomes an important issue in terms of not only the practicality of the process, but also the protection of both Parylene-Si substrate and Parylene-Parylene adhesion. It is also possible to decrease the width of the Parylene cables, so that there will be fewer connectors on each cable, and it will take less time for the cables to release.

This is a simplified process flow to examine the feasibility and strength of Parylene as the structural material, and it has no layers fabricated for electrostatic actuation. However it is to be understood that this is relatively easy to do. Also, it is possible to electroplate gold on the electrical connector tips so that there will be extruding gold bumps for improved electrical connection. Both actuation layer fabrication and gold bump fabrication at the electrical connector tips are the two additional steps that may be added but are not included here.

Fabrication of gold cables is similar to that of Parylene cables with the difference that each electrical connector is separate instead of a wide cable with many conductors embedded in it. The fabrication also requires much care, because if sacrificial photoresist layers are not hard baked enough, the remaining solvent in the photoresist may cause bubbles and cracks on the thick sputtered Au layer. Long and elevated-temperature hard baked photoresist is also harder to remove during the release process.

The Parylene cable fabrication process has been used to fabricate a prototype cube. FIGS. 5 through 11 show assembly of the cube. The sidewalls 16 support an array of Parylene cables 14 (naturally bent up due to their intrinsic stress, especially for electrostatic actuation). The dimension of the cube may be 1 cm×1 cm×1 cm, and the Parylene cables' dimension are typically 1 mm×1 mm each.

As described above, highly flexible Parylene cables 14 are used to assemble multi-substrate microsystems in a compact and modular approach. The stacked packaging approach provides a re-workable platform for microsystems, which contain various substrates 12 which can be fabricated with different technologies. Parylene is used as the structural material for electrical and fluidic connectors because of its high flexibility, chemical inertness, and conformal deposition. Several cables 14 have been fabricated and tested for flexibility and strength. Cables 14 with gold as the structural material have also been fabricated.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A multi-substrate package comprising:
   a housing;
   a stack of substrates disposed within the housing; and
   an array of connectors including a plurality of channels supported by the housing, wherein the connectors are movable between extended and retracted positions within the housing and wherein the connectors connect multiple substrates in the extended positions of the connectors to communicate the multiple substrates along the channels.

2. The package as claimed in claim 1, further comprising at least one actuator for moving the connectors between the extended and retracted positions.

3. The package as claimed in claim 2, wherein the connectors are flexible connectors and wherein the at least one actuator flexes the connectors so that the connectors move between the extended and retracted positions.

4. The package as claimed in claim 1, wherein the channels include fluid channels and the connectors include fluid connectors.

5. The package as claimed in claim 1, wherein the channels include electrical channels and the connectors include electrical connectors.

6. The package as claimed in claim 1, further comprising at least one resilient sheet for separating the multiple substrates and applying a force between the connectors and the substrates required for proper communication of the multiple substrates.

7. The package as claimed in claim 6, wherein the housing includes a cover for applying a force to the stack and wherein the at least one resilient sheet is compressed by the force to the stack so that the at least one resilient sheet presses terminations of the connectors against terminations on the substrates and wherein contacts between the connectors and the substrates at the terminations are pressure contacts.

8. The package as claimed in claim 1, wherein the housing includes side walls and wherein the connectors are formed on the side walls.

9. The package as claimed in claim 1, wherein the housing is rectangular in shape.

10. The package as claimed in claim 2, wherein the at least one actuator includes an electrostatic, magnetic, piezoelectric, or thermal actuator.

11. The package as claimed in claim 1, wherein the connectors are made from Parylene or any other suitable polymer, metal or inorganic dielectric.

12. The package as claimed in claim 1, wherein distal ends of the connectors have termations formed thereon and wherein the substrates have termations which match the terminations of the connectors to form a connect/disconnect system.

13. The package as claimed in claim 1, wherein the housing includes a plurality of connector substrates which support the connectors.

14. The package as claimed in claim 1, further comprising a sensor supported on a sensor substrate exposed to an environment of the package and wherein the rest of the substrates are hermetically sealed from the environment by the housing and the sensor substrate.

15. The package as claimed in claim 1, wherein the connectors permit removal of the substrates from the housing in retracted positions of the connectors.

16. The package as claimed in claim 1, further comprising a battery disposed within the housing for providing electrical power to the substrates.

17. The package as claimed in claim 1, wherein the connector array includes at least one flexible cable.

18. The package as claimed in claim 1, wherein the housing is a folded housing.

19. The package as claimed in claim 1, wherein the channels include fluid and electrical channels and wherein the connectors include fluid and electrical connectors including the fluid and electrical channels, respectively.

20. The package as claimed in claim 1, further comprising at least one MEMS device supported on a MEMS substrate.

21. The package as claimed in claim 1, wherein the array includes rows of movable connectors and wherein each row is individually movable.

22. The package as claimed in claim 1, wherein distal ends of the connectors are locally adjacent an inner surface of the housing in the retracted positions to allow both insertion and removal of the substrates from the housing.

* * * * *